(12) United States Patent
Chang et al.

(10) Patent No.: US 12,019,032 B2
(45) Date of Patent: Jun. 25, 2024

(54) ELECTRONIC SYSTEM AND METHOD OF SPECIMEN QUALIFICATION

(71) Applicant: NANYA TECHNOLOGY CORPORATION, New Taipei (TW)

(72) Inventors: Hung-Chih Chang, New Taipei (TW); Chug-Chi Chu, New Taipei (TW); Chi-Min Tu, New Taipei (TW); Wun-Ye Ku, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 785 days.

(21) Appl. No.: 17/113,510

(22) Filed: Dec. 7, 2020

(65) Prior Publication Data

US 2022/0178845 A1    Jun. 9, 2022

(51) Int. Cl.
*G01N 21/95* (2006.01)
*G03F 7/039* (2006.01)

(52) U.S. Cl.
CPC ....... *G01N 21/9505* (2013.01); *G03F 7/0392* (2013.01); *G01N 21/9503* (2013.01)

(58) Field of Classification Search
None
See application file for complete search history.

(56) References Cited

U.S. PATENT DOCUMENTS

| | | | |
|---|---|---|---|
| 6,784,446 B1 * | 8/2004 | Phan | G01N 21/95692 250/559.4 |
| 7,664,310 B2 * | 2/2010 | Emery | G03F 1/26 356/237.4 |
| 10,572,995 B2 * | 2/2020 | Inoue | G01N 21/95607 |
| 10,887,580 B2 * | 1/2021 | Kolchin | H04N 13/221 |
| 10,916,472 B2 * | 2/2021 | Clark | H01L 21/67703 |
| 11,047,806 B2 * | 6/2021 | Bhattacharyya | G01N 23/04 |
| 11,301,748 B2 * | 4/2022 | Sha | G06T 7/0004 |
| 11,675,958 B2 * | 6/2023 | Tien | G03F 1/36 716/53 |
| 2020/0151538 A1 * | 5/2020 | Sha | G06V 10/774 |
| 2020/0232934 A1 * | 7/2020 | Feldman | G06T 7/001 |
| 2020/0400589 A1 * | 12/2020 | Feldman | G06T 7/0008 |
| 2021/0073972 A1 * | 3/2021 | Wu | G06N 3/08 |
| 2021/0357571 A1 * | 11/2021 | Tien | G06F 30/337 |
| 2021/0364450 A1 * | 11/2021 | Lauber | G06T 5/50 |

(Continued)

FOREIGN PATENT DOCUMENTS

| | | |
|---|---|---|
| CN | 108291878 A | 7/2018 |
| CN | 109596638 A | 4/2019 |

(Continued)

*Primary Examiner* — Anand P Bhatnagar
(74) *Attorney, Agent, or Firm* — Muncy, Geissler, Olds & Lowe, P.C.

(57) ABSTRACT

The present disclosure provides an electronic system with defect identification function and a method of qualifying a photoresist pattern formed using a lithography process. The electronic system includes an inspection apparatus and a processor associated with the inspection apparatus. The inspection apparatus is used for acquiring at least one image of the specimen on which a photoresist pattern is formed using a lithography process. The processor is configured to automatically apply machine learning processes implemented through one or more neural networks to identify at least one defect present in the photoresist pattern.

13 Claims, 12 Drawing Sheets

(56) References Cited

U.S. PATENT DOCUMENTS

2022/0129775 A1* 4/2022 Burov .................... G06N 7/01
2022/0375063 A1* 11/2022 Pisarenco ............... G03F 7/705

FOREIGN PATENT DOCUMENTS

| | | |
|---|---|---|
| JP | 2017083174 | 5/2017 |
| TW | 201909303 A | 3/2019 |
| TW | 201932827 A | 8/2019 |
| TW | 201937163 A | 9/2019 |
| TW | 201941787 A | 11/2019 |
| TW | 201945861 A | 12/2019 |

* cited by examiner

FIG. 8

| | | | | WIP Lots | | |
|---|---|---|---|---|---|---|
| Seq | priority | Auto Judge | Alias Number | Lot ID | Oper No | FOUP ID |
| 01 | 8 | | | M00834O01E | 200.000080 | SFA12008 |
| 02 | 4 | | | P93839300E | 934.201000 | SFA72923 |
| 03 | 3 | NG | @08 | P95058300E | 934.201000 | SFA73609 |
| 04 | 7 | | | P94803200E | 876.201050 | SFA73335 |
| 05 | 7 | | | P00414000E | 823.151050 | SFA23326 |
| 06 | 3 | | | P00634000E | 640.151050 | SFA08182 |
| 07 | 3 | | | P00505203E | 494.151050 | SFA01877 |
| 08 | 7 | NG | @25 | P00831900E | 409.151050 | SFA20632 |
| 09 | 7 | NG | @04,15,17,18 | P00914200E | 325.151050 | SFA22383 |

ELECTRONIC SYSTEM AND METHOD OF SPECIMEN QUALIFICATION

TECHNICAL FIELD

The present disclosure relates to an electronic system and a qualification method, and more particularly, to an electronic system with defect identification function and a method of qualifying a photoresist pattern formed using a lithography process.

DISCUSSION OF THE BACKGROUND

In the manufacturing of integrated circuits, electronic circuits with various semiconductor devices are formed on a substrate using a number of semiconductor fabrication processes. Lithography, the process in which a photoresist pattern is used for patterning one or more features of the semiconductor devices formed on the substrate, is considered one of the most important processes in integrated circuit manufacturing.

FIG. 1 is a flow diagram illustrating a method 10 of forming a photoresist pattern on a substrate, and FIGS. 2A to 2D illustrate cross-sectional views of intermediate stages in formation of a photoresist pattern on a substrate. Referring to FIG. 2A, the substrate 102 is provided and a photosensitive material 104 is applied on the substrate 102 according to a step S12 in FIG. 1. The substrate 102 can be a bare wafer formed of a semiconductor or non-semiconductor material. Alternatively, the substrate 102 may include one or more layers that may be formed upon a bare wafer. For example, such layers may include, but are not limited to, a dielectric material and a conductive material, wherein the interplay of the material changes the electrical characteristics of a microelectronic or micromechanical device.

The photosensitive material 104 is a liquid material that can be applied on the substrate 102 by a spin-coating process or a spray-coating process. The liquid photosensitive material 104 is then dried using a soft-baking process. The soft-baking process can remove a solvent, such as polymethylmethacrylate (PMMA), from the photosensitive material 104 and harden the photosensitive material 104.

Next, a reticle 110 is provided in proximity to the substrate 102. The reticle 110 is a binary reticle including a transparent layer 112 and one or more opaque layers 114 with a specific geometric pattern disposed on the transparent layer 112 made of, for example, glass or quartz.

Referring to FIG. 2B, an exposure process is performed to expose at least one defined region of the photosensitive material 104 to actinic radiation 120 through the reticle 110 according to a step S14 in FIG. 1. The actinic radiation 120 is directed toward the reticle 110 so as to enable exposure of the photosensitive material 104 to the geometric pattern which corresponds to the feature or features that are desired to be formed. Generally, the actinic radiation 120 is blocked by the geometric pattern (comprised of the opaque layers 114) but passes through at least one transparent region not covered by the opaque layers 114 to pattern the photosensitive material 104, so that a duplicate of the geometric pattern on the reticle 110 appears in the photosensitive material 104. The actinic radiation can be visible light, ultraviolet radiation, or deep ultraviolet radiation. Alternatively, the actinic radiation may be X-ray for the fabrication of high-aspect ratio and high-resolution microstructures, or particle beam, such as e-beam or ion-beam, used to modify properties of the photosensitive material 104. After the performing of the exposure process, the photosensitive material 104 is comprised of at least one exposed portion 1042 and at least one unexposed portion 1044.

Referring to FIGS. 2C and 2D, a developing process is performed to selectively remove the defined portions of the photosensitive material 104 using a developer solution according to a step S16 in FIG. 1. Therefore, the photoresist pattern 106 is formed on the substrate 102 being processed. In FIG. 2C, the photosensitive material 104 is positive tone material, so that the exposed portion 1042 is of the photosensitive material 104 shown in FIG. 2B is removed by the developer solution. Alternatively, the photoresist pattern 106 can be formed by removing the unexposed portion 1044 of the photosensitive material 104 shown in FIG. 2B using a developer solution when the photosensitive material 104 is negative-tone material, as shown in FIG. 2D.

The photoresist pattern 106 is used to protect a corresponding pattern of underlying areas on the substrate 102 during subsequent fabrication processes, such as deposition, etching or ion implantation processes. That is, the photolithography process is used to define the pattern on the substrate 102, which will be deposited, etched, or otherwise modified to form the microelectronic or micromechanical device.

However, as the dimensions of integrated circuits decrease and the geometric pattern being transferred from the reticle 110 to the photoresist pattern 106 after the lithography process become more complex, defects in the photoresist pattern 106 become increasingly important because such defects can generate defects (such as shorts or opens) during subsequent fabrication processes. Accordingly, it is necessary to develop a system and a method for determining whether the photoresist pattern 106 is fabricated as designed.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides an electronic system for specimen qualification. The electronic system includes an inspection apparatus and a processor associated with the inspection apparatus. The inspection apparatus is used for acquiring at least one image of the specimen on which a photoresist pattern is formed using a lithography process. The processor is configured to automatically apply machine-learning processes implemented through one or more neural networks to identify at least one defect present in the photoresist pattern.

In some embodiments, the processor is operable to identify, using a clustering algorithm, the specimen having discoloration issue.

In some embodiments, the processor is operable to implement a convolutional neural network to identify the defect on the specimen.

In some embodiments, the processor is configured to identify the defect on the specimen using an instance segmentation algorithm.

In some embodiments, the convolutional neural network for performing image segmentation is a Mask R-CNN.

In some embodiments, the processor is operable to identify the defect on the specimen using a matching algorithm and/or an edge detection algorithm.

In some embodiments, the electronic system further includes a database connected to an inspection apparatus and the processor, wherein the images provided by the inspection apparatus are transmitted to and stored in the database, and the processor accesses the database to receive the images for determination.

In some embodiments, the electronic system further includes at least one transmission media, wherein the inspection apparatus, the processor, and the database are connected by the transmission media.

In some embodiments, the inspection apparatus includes a stage, an illuminator and a detector; the stage is employed to carry the specimen, the illuminator is configured to condition light for illuminating the specimen, and the detector is used to capture the image of the specimen.

One aspect of the present disclosure provides a method of qualifying a plurality of specimens of at least one lot. The method includes steps of inspecting the plurality of specimens for generating a plurality of images of the specimens; performing an automated qualification to determine whether the specimens are defective specimens based on the images; and performing a manual qualification to identify at least one failed specimen from the defective specimens.

In some embodiments, the method further includes a step of notifying on-site technicians of the defective specimens on at least one operator interface.

In some embodiments, the method further includes steps of determining whether qualified specimens need to be sampled after the automated qualification; and performing the manual qualification on some of the qualified specimens.

In some embodiments, the automated qualification is implemented by a clustering algorithm that groups the images of the defect-free specimens together and separate from the images of the defective specimens.

In some embodiments, the automated qualification is implemented by a convolutional neural network for performing image segmentation to determine the defective specimen in the acquired image.

In some embodiments, the automated qualification is implemented by a matching algorithm that compares the image of the specimens to specifications.

In some embodiments, the automated qualification is implemented by an edge detection algorithm that reveals boundaries between regions of contrasting image intensity.

With the above-mentioned configurations of the electronic system, machine vision and automated qualification are employed to detect the defective photoresist pattern to not only provide an accurate and consistent classification capability but also to perform analysis, thereby improving production efficiency and increasing profits.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by is those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

FIG. 8 shows an exemplary display of an operator interface in accordance with some embodiments of the present disclosure.

DETAILED DESCRIPTION

Figure 1:
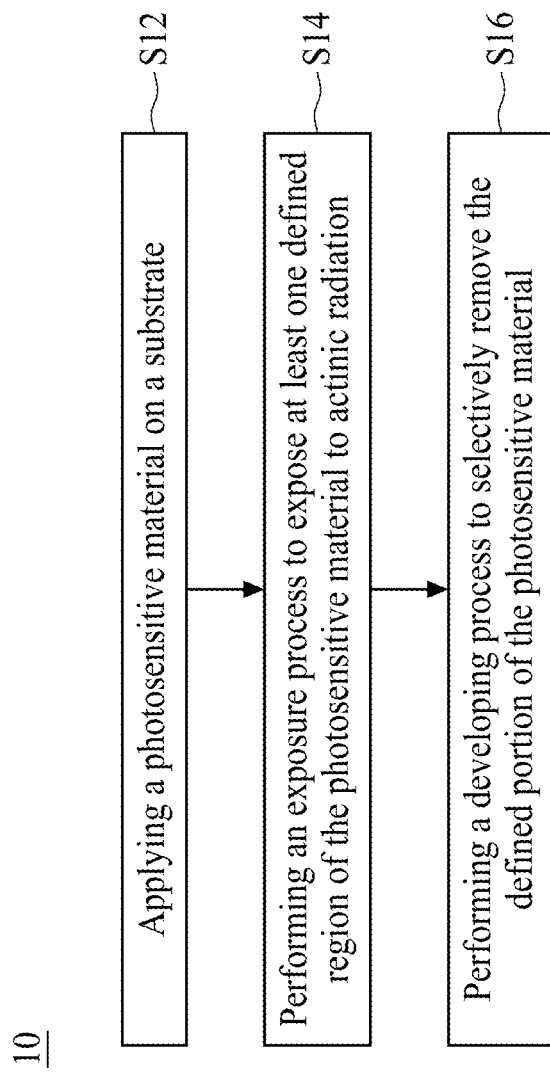
FIG. 1 is a flow diagram illustrating a method of forming a photoresist pattern on a substrate.
Figure 2A:
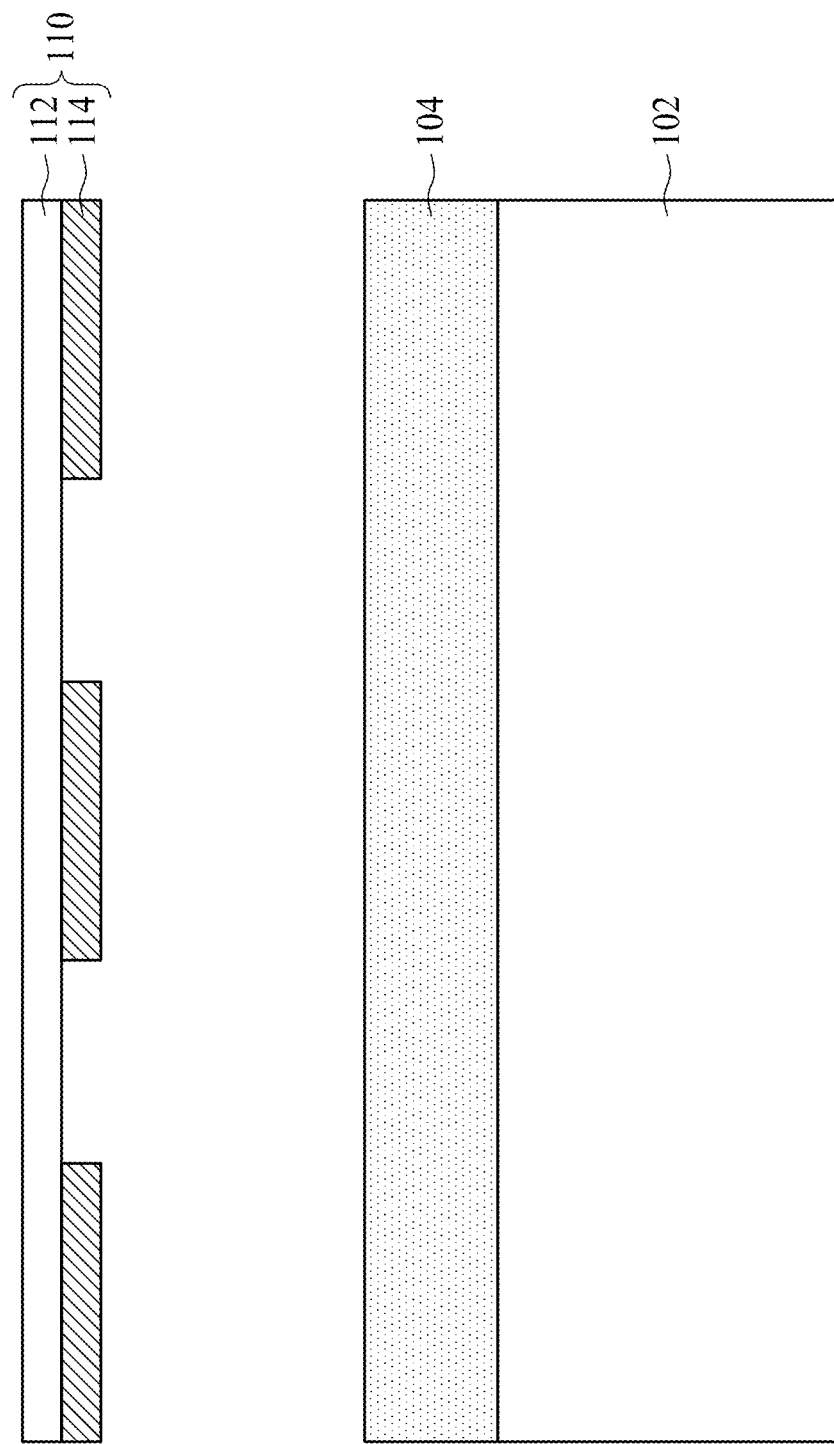
FIGS. 2A to 2D illustrate cross-sectional views of intermediate stages in the formation of the photoresist pattern on the substrate.
Figure 2B:
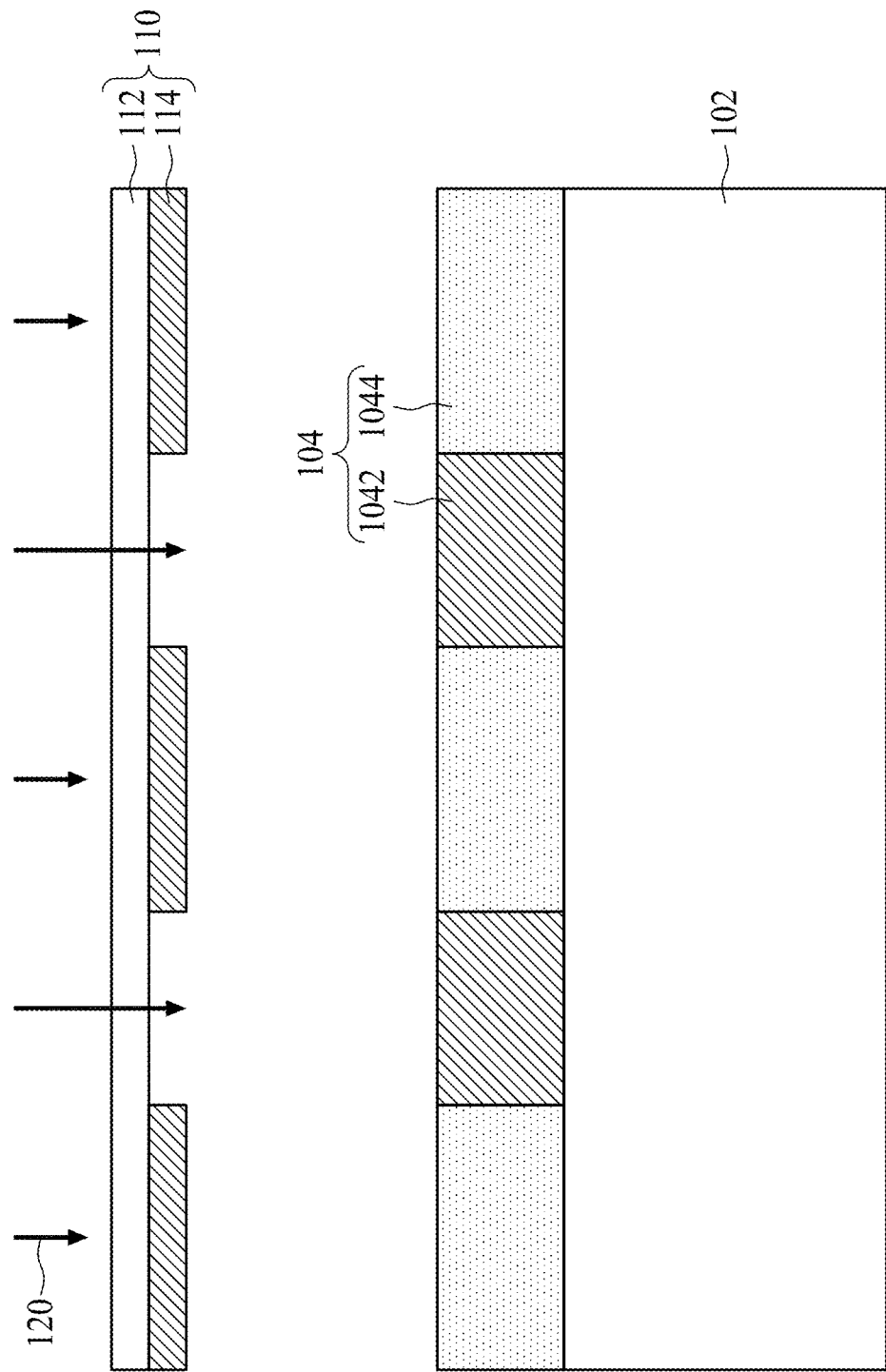
Figure 2C:
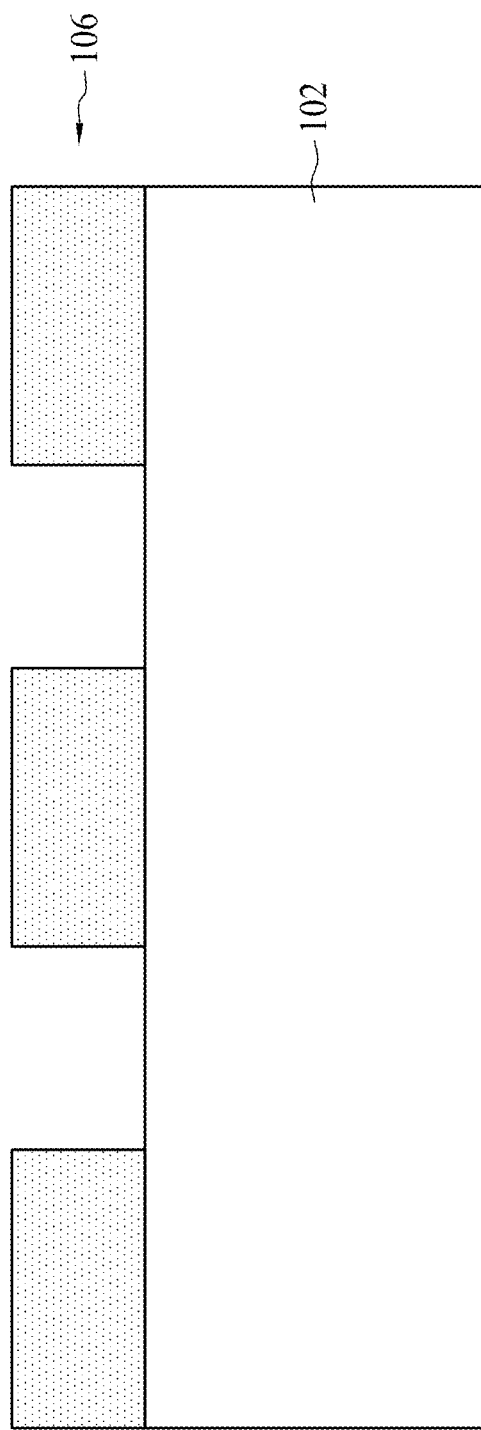
Figure 2D:
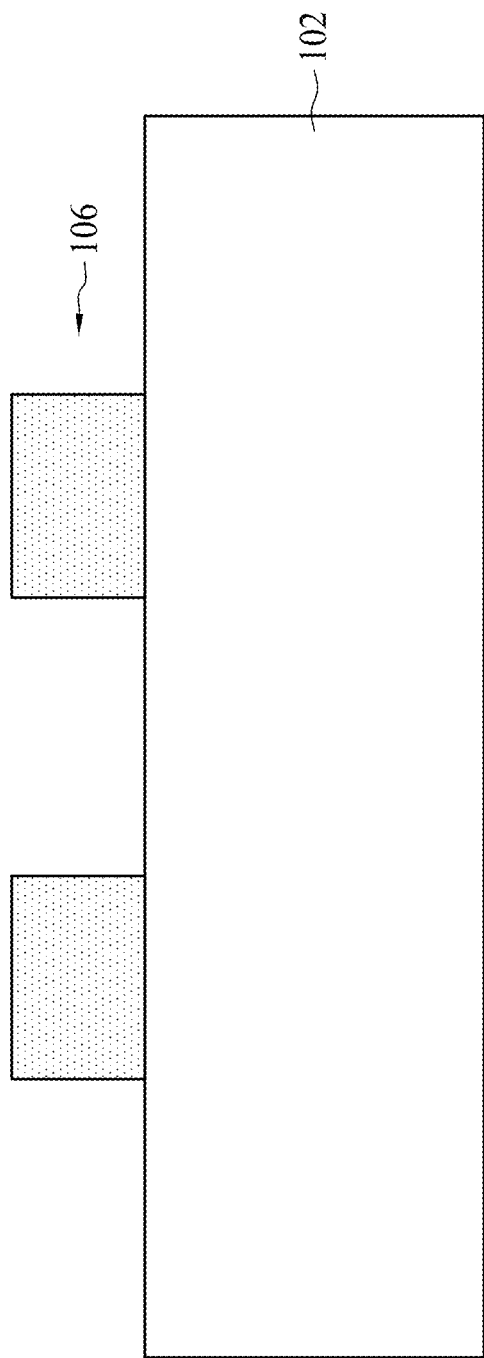

Embodiments, or examples, of the disclosure illustrated in the drawings are described below using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 3:
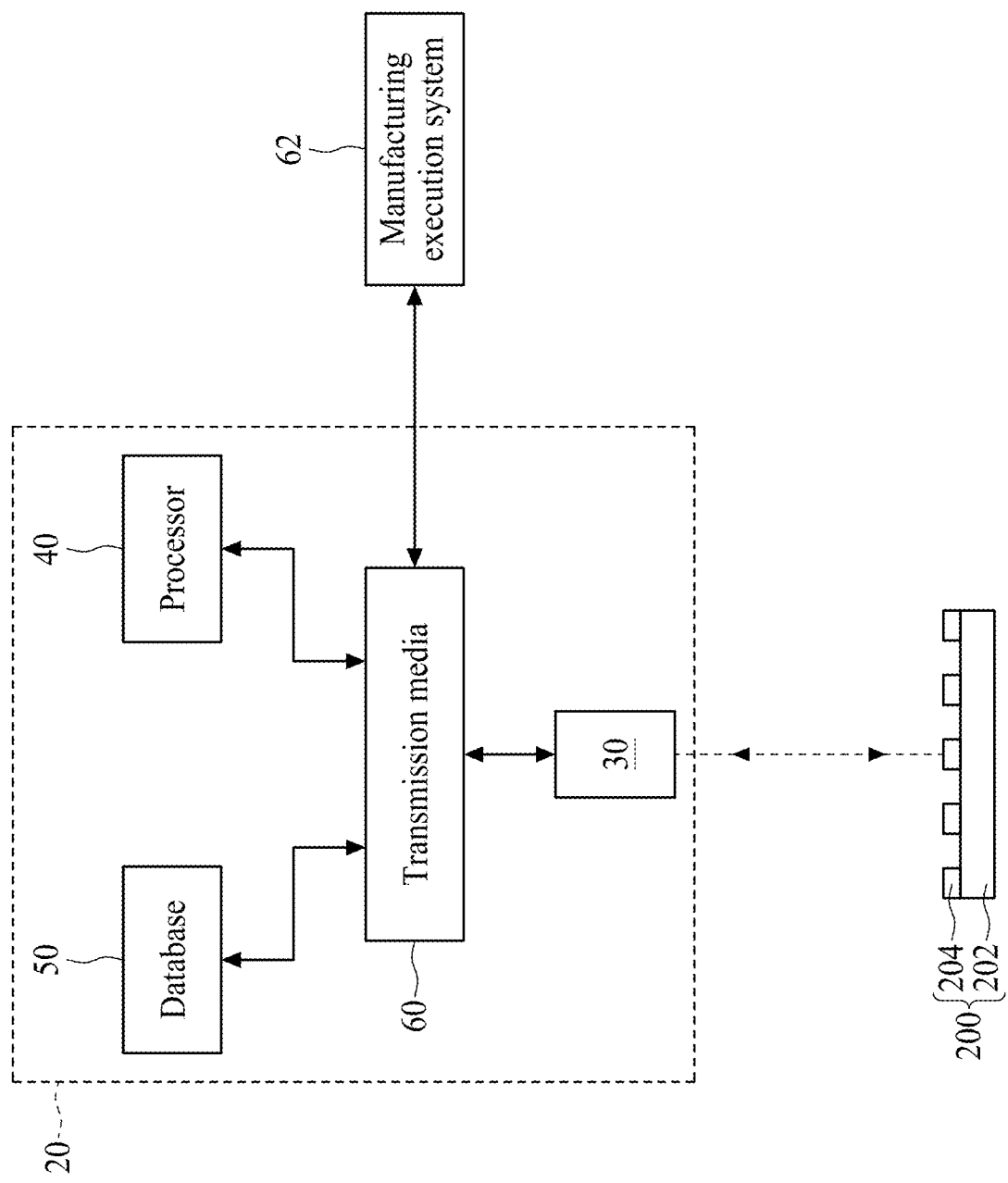
FIG. 3 is a schematic diagram of an electronic system with defect identification function in accordance with some embodiments of the present disclosure.

FIG. 3 is a schematic diagram of an electronic system with defect identification function in accordance with some embodiments of the present disclosure. The electronic system 20 is configured to inspect a plurality of specimens 200 (in a lot) that are in an inspection queue. Referring to FIG. 3, the electronic system 20 includes an inspection apparatus 30 for inspection and a processor 40 associated with the inspection apparatus 30 for qualification. Specifically, the inspection apparatus 30 is used to inspect a plurality of specimens 200 and generate one or more inspection results after the inspection of each specimen 200. The processor 40 is configured to execute program instructions for performing one or more computer-implemented methods including identifying defects on the specimen 200 based on the inspection results. The processor 40 may be further configured to characterize the defects on the specimen 200 based on the inspection results.

The inspection results provided by the inspection apparatus 30 can be transmitted to and stored in at least one database 50 in advance, and the processor 40 is configured to access the database 50 to acquire is the inspection results for determining whether one or more defects are present on the specimen 200. The inspection apparatus 30, the processor 40 and the database 50 can be connected by transmission media 60 such as wires, cables, wireless transmission paths, and/or a network. Alternatively, the inspection apparatus 30 can feed the inspection results into the processor 40 in real time through a hardwired connection or a wireless connection if the processor 40 has sufficient processing capability to analyze the inspection results provided by the inspection apparatus 30. The processor 40 may reside in a personal computer (PC) including a memory used to store instructions for the processor 40 to execute or data for the processor 40 to operate on; the inspection results can be stored in the memory residing in the PC if the memory has sufficient storage capability to store the inspection result of at least one lot of specimens 200. In some embodiments, the processor 40 can perform additional operations, functions, and control of the electronic system 20 during the execution of the instructions. In alternative embodiments, the PC may further include a central processing unit (CPU) controlling and coordinating operations of the PC.

Figure 4:
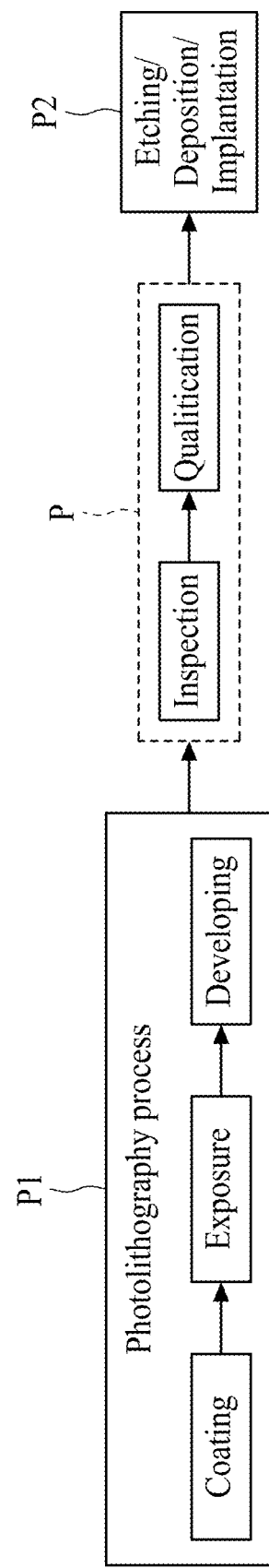
FIG. 4 is a flow diagram illustrating a method of processing a substrate in accordance with some embodiments of the present disclosure.

The electronic system 20 performs a process P including inspection and qualification on the specimen 200 after a first fabrication process is performed on the specimen 200 and before a second fabrication process is performed on the specimen 200. Referring to FIGS. 3 and 4, for example, the first fabrication process P1 is a photolithography process, mainly comprised of stages of photosensitive material coating, exposure and developing, and transferring a pattern on a reticle to a photosensitive material arranged on a substrate 202, thereby forming a photoresist pattern 204 to expose at least one portion of the substrate 202. The second fabrication process P2 can be a deposition process including depositing a dielectric or a conductor on the portion of the substrate 202 exposed through the photoresist pattern 204, an etching process including removing the portion of the substrate 202 not protected by the photoresist pattern 204, or an ion implantation process including introducing dopants in the portion of the substrate 202 not covered by the photoresist pattern 204. That is, the inspection process that is performed by the electronic system 20 of the present disclosure is an after-development inspection (ADI) process. The ADI process and the qualification process following the ADI process allow engineers to capture defects of interest (DOI) that appear in the photosensitive material 104 before the substrate 202 is processed, so that the specimen 200 can be reworked by removing the defective photoresist pattern 204 and redoing the photolithography process to form a defect-free photoresist pattern 204 on the substrate 202.

Generally, the defective photoresist pattern 204 may be caused, for example, by dust existing in the photoresist pattern 204 or attached to the surface of the photoresist pattern 204 (i.e., the particle issue), by deterioration of the photoresist pattern 204 due to floating chemical species in a clean room (i.e., the discoloration issue), by coating failure of the photoresist pattern 204 (including poor coating and splash), or by exposure failure (i.e., the defocusing issue). The electronic system 20, shown in FIG. 3, is employed to conduct at least one non-invasive inspection of a pattern profile of each specimen 200 and performs automated specimen qualification. Specifically, the inspection apparatus 30 of the electronic system 20 is used to perform at least one optical inspection to acquire one or more images of the specimen 200, including the photoresist pattern 204, and the processor 40 is employed to identify any defective photoresist patterns 204 in the image(s) acquired by the inspection apparatus 30. That is, the image(s) of the specimen 200 captured by the inspection apparatus 30 can be used to detect the presence of defects on the specimen 200.

Figure 5:
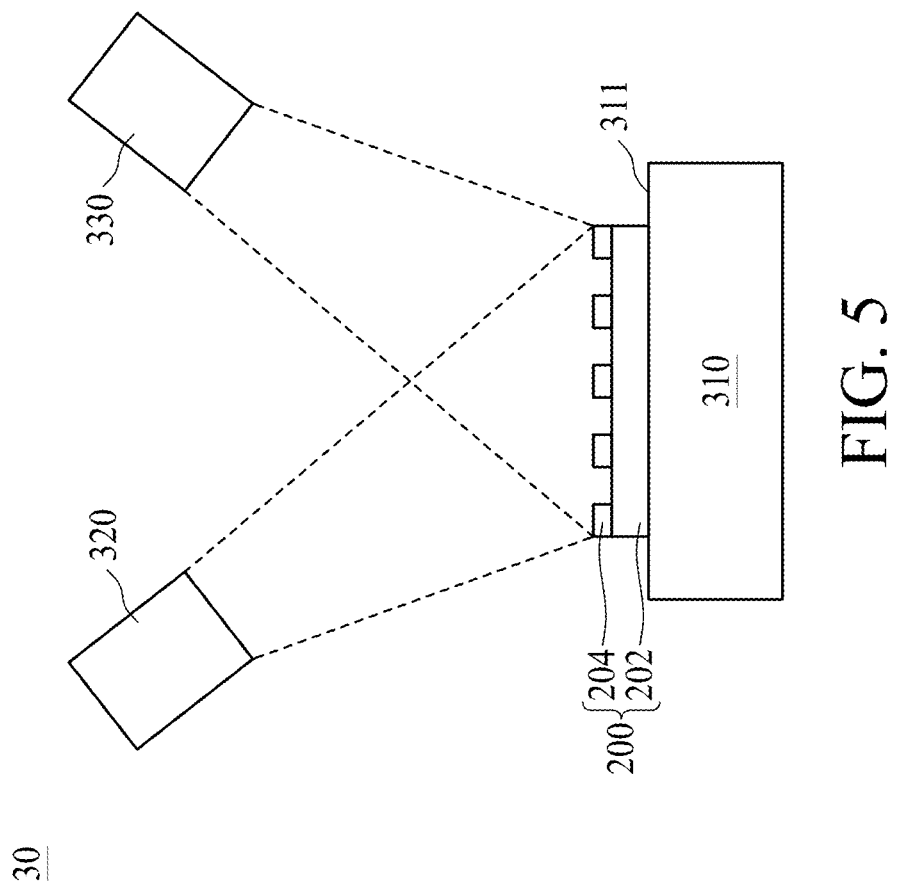
FIGS. 5 and 6 are schematic diagrams of inspection apparatuses in accordance with some embodiments of the present disclosure.
Figure 6:
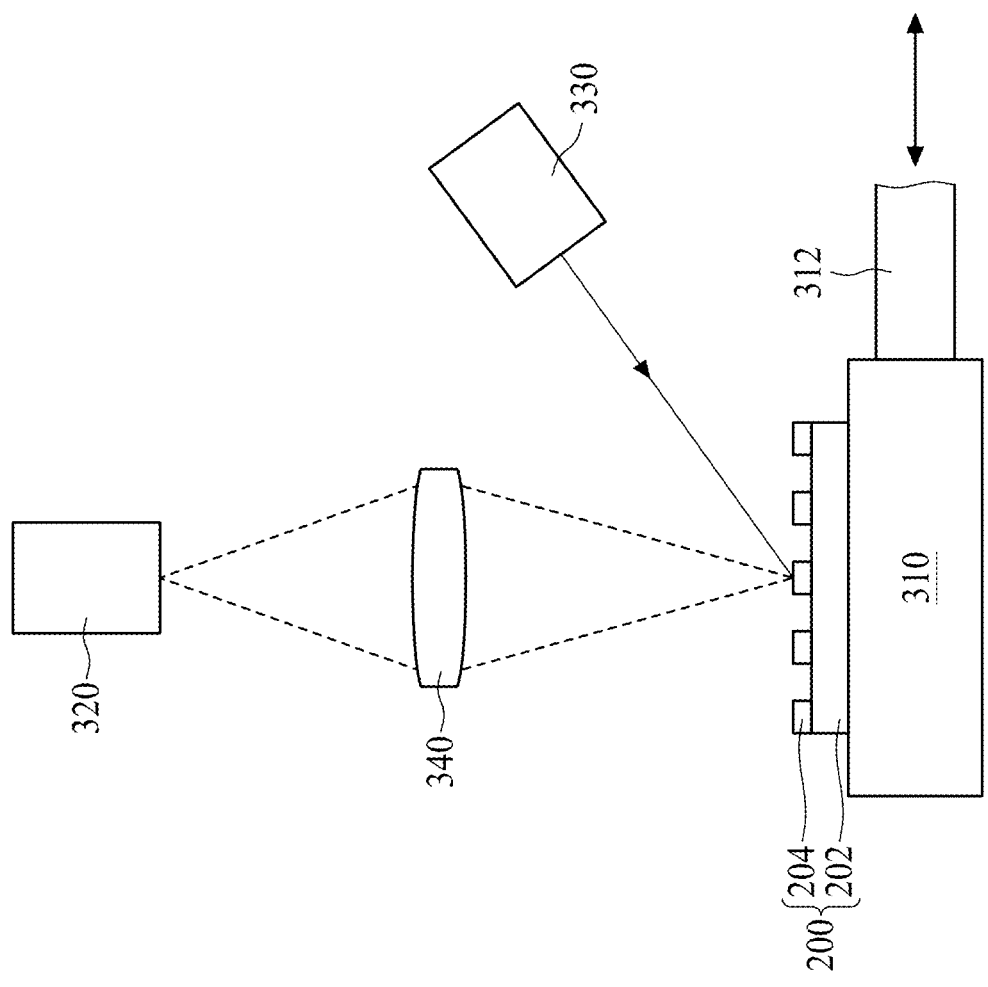
Figure 7:
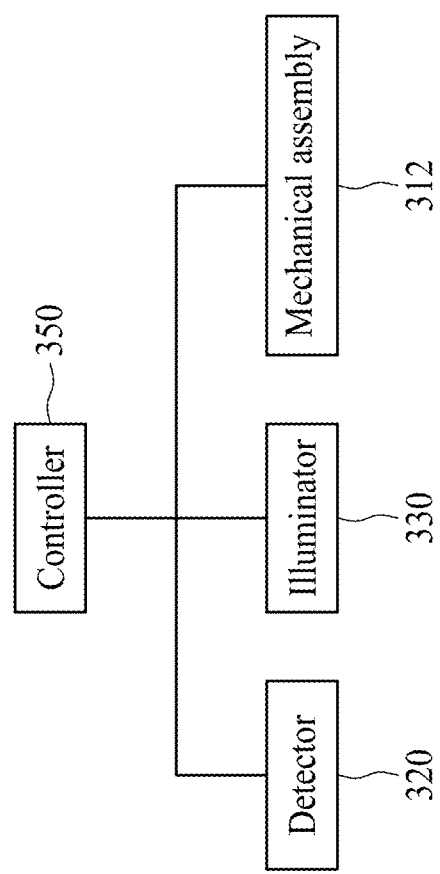
FIG. 7 is a function block diagram of an inspection apparatus in accordance with some embodiments of the present disclosure.

FIGS. 5 and 6 are schematic diagrams of an inspection apparatus in accordance with some embodiments of the present disclosure, and FIG. 7 is a function block diagram of the inspection apparatus in accordance with some embodiments of the present disclosure. Referring to FIGS. 5 and 6, the inspection apparatus 30, configured to acquire images of the specimen 200, includes a stage 310 on which the specimen 200 is disposed during the inspection and at least one detector 320 to detect light reflected from (or deflected by) from the specimen 200. The detector 320 can include digitizing and computing circuitry configured to generate output that is responsive to light reflected from the specimen 200. In some embodiments, the detectors 320 can include complementary metal oxide silicon (CMOS) image sensors.

In FIG. 5, the detector 320 can capture the image of the entire specimen 200 at a shot time when it has a field of view (indicated by a dashed line) that covers substantially the entire specimen 200. In such apparatus, the stage 310 is a fixed stage and the image acquisition time can be effectively reduced. In some embodiments, the detector 320 has an optical axis inclined at a predetermined angle in relation to a surface 311 of the stage 310 for positioning the specimen 200. In FIG. 6, the detector 320 is used to capture the image of a limited area of the specimen 200 during one shot time, so that the stage 310 can be driven by a mechanical assembly 312 to move the specimen 200 with respect to the inspection apparatus 30 during inspection. The mechanical assembly 312 may control movement of the stage 310 in response to instructions provided by a controller 350 shown in FIG. 7.

Referring again to FIGS. 5 and 6, the inspection apparatus 30 further includes at least one illuminator 330 configured to condition light for illuminating the specimen 200. The illuminator 330 can be halogen lamps or light-emitting diodes (LEDs) for generating light. In some embodiments, the illuminator 330 has an optical axis inclined at a predetermined angle in relation to the surface 311 of the stage 310 for positioning the specimen 200. The light generated by the illuminator 330 can provide monochromatic light at a shot time for better sensitivity and visibility for detection by the detector 320. The light is preferably within a range of about 400 to 700 nanometers (nm) in a visible light spectrum. However, the light generated by the illuminator 330 is not limited to visible light, and may be light in a different wavelength spectrum such as an infrared light, as long as it does not include a wavelength that affects the photosensitive material (i.e., ultraviolet light). Referring to FIG. 7, the controller 350 is further electrically connected to the illuminator 330 to adjust brightness for illuminating the specimen 200.

Referring again in FIG. 6, the inspection apparatus 30 may also include a lens 340. The detector 320 is spatially oriented within a focal plane of the lens 340, so that the light reflected from the specimen 200 can be accurately directed onto the detector 320.

Referring again to FIG. 3, the processor 40 is configured to execute graphical operations used to identify the defective photoresist pattern 204 by analyzing the images that are acquired by the inspection apparatus 30. The graphical operations executed by the processor 40 is may include comparing the images acquired by the inspection apparatus 30 and analyzing whether defects are present on the specimen 200 based on the result(s) of the comparison. Alternatively, the graphical operation can compare the image(s) acquired by the inspection apparatus 30 with one or more reference images retrieved from the database 50 and analyze the results of the comparison to determine whether defects are present on the specimen 200. The reference image(s) may be obtained from a foreign defect-free specimen 200 acquired by the inspection apparatus 30 or a simulated image illustrating how the photoresist pattern 204 in the design would ideally be formed on the substrate 202. In some embodiments, the processor 40 can be a specialized processor, such as a graphics processing unit (GPU) or a general-purpose GPU (GPGPU), residing in a personal computer (PC), wherein the GPU or the GPGPU includes one or more graphics processing cores. In alternative embodiments, the functions described for the processor 40 may be performed by one or more computers throughout the system.

In additions, the processor 40 may further acquire design data of the specimen 200 during the qualification. The design data may include information related to any of the processes performed in a fab including, but not limited to, tool history, substrate processing history, reticle history, and operating specifications. The processor 40 may acquire the design data from a manufacturing execution system (MES) 62 associated with the processor 40 through the transmission media 60. The MES 62 may control the flow of the specimen lots in the fabrication flow and allows manufacturers to configure their factory resources and process plans, track inventory and orders, collect and analyze production data, monitor equipment, dispatch work orders to manufacturing operators, and trace consumption of components into finished products. In some embodiments, the design data related to the status of the various entities and at least one specimen lot of manufacture in the process flow can be transmitted from the MES 62 to the database 50 prior to the inspection, and the processor 40 can then access the database 50 to acquire the design data during the qualification of the specimen 200.

Figure 9:
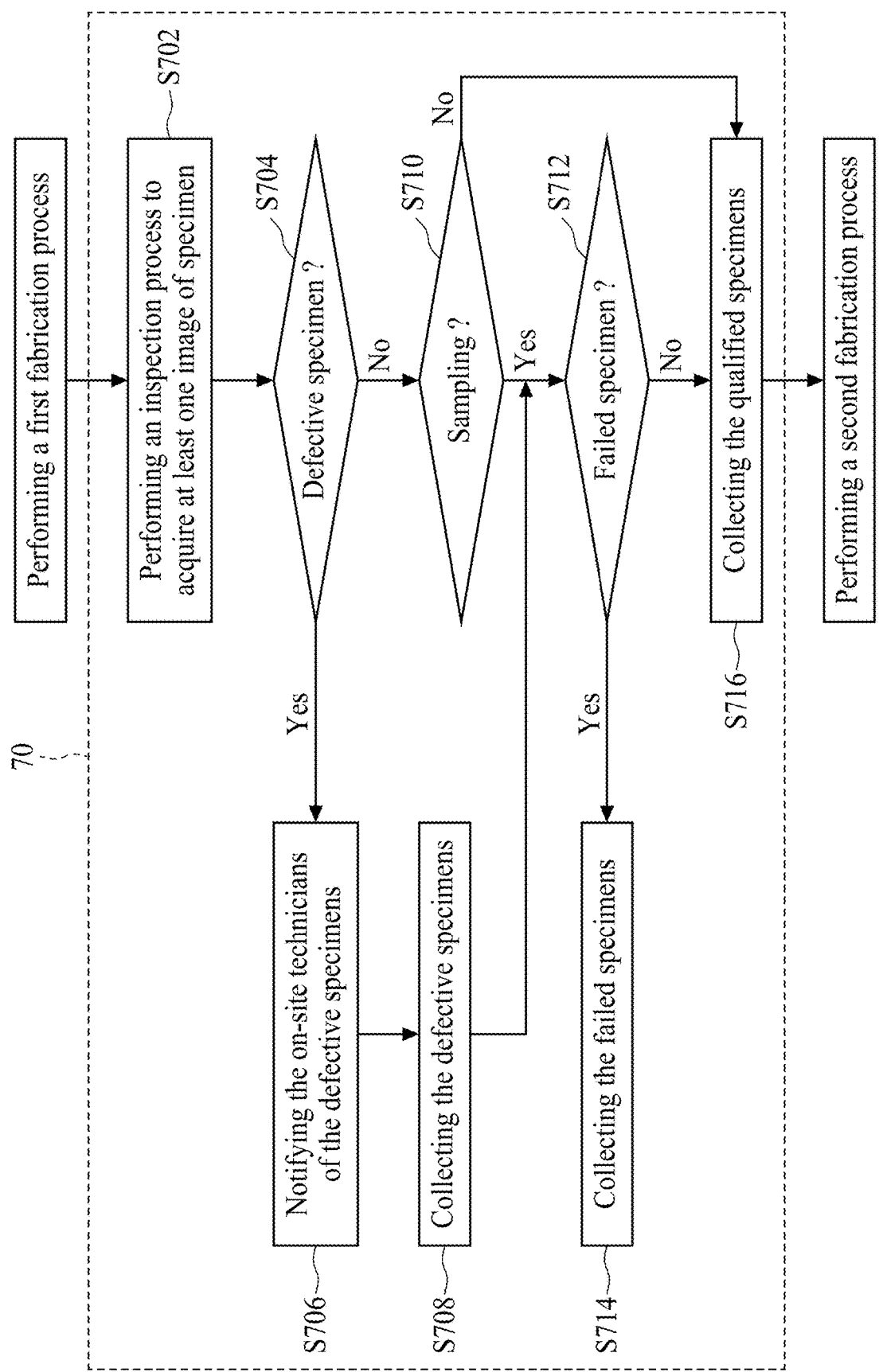
FIG. 9 is a flow diagram illustrating a method of inspecting a specimen on which a photoresist pattern is formed in accordance with some embodiments of the present disclosure.

The qualification of each specimen 200 provided by the processor 40 can be synchronously displayed on one or more operator interfaces. The operator interfaces allow on-site technicians to view telemetry and status data associated with the specimens 200 (as shown in FIG. 9), and to control some aspects of the processor 40 and/or the MES 62. These operator interfaces typically execute on computers that are networked to the processer 40 or at least one industrial controller used to control the MES 62, and render selected subsets of data read from the processor 40 and the controller in animated graphical or text formats on pre-developed display screens. Operator interfaces can be used to monitor such information as production statistics, real-time telemetry data (including, but not limited to, the flow rate of the specimens 200 to be inspected and motor speeds of the stage 310) (as shown in FIG. 8), status of the inspection apparatus, alarm conditions, or other such metrics of the electronic system 20 being monitored.

The processor 40 can perform clustering on the inspection results, such that the specimens 200 in the lot with discoloration issue can be identified. In some embodiments, the specimen qualification may be implemented by a clustering algorithm that groups the images of the defect-free specimens 200 together and separate from the images of the defective specimens 200, in order to identify or recognize is defects in the images acquired by the inspection apparatus 30. In some embodiments, a K-means algorithm is used for clustering.

The processor 40 may gather the images acquired from qualified or defect-free specimens 200 (hereafter referred to as "the samples"), and the clustering algorithm can extract a discernable feature, such as dominant color, from the images of the samples, and define a centroid color from the dominant colors extracted from the samples before the qualification of the specimens 200 in the lot waiting to be qualified. In some embodiments, the dominant colors and the centroid color can be mathematically defined by an RGB triplet, for example. The images of the samples acquired by the inspection apparatus 30 may be, for example, stored in the database 50, and the processor 40 may access the database 50 to gather the images of the samples prior to the extracting of the dominant colors and the defining of the centroid color. In some embodiments, the dominant colors of the samples and the centroid color derived from the dominant colors of the samples may be stored in the database 50 before the qualification of the specimens 200 in the lot waiting to be qualified.

During the qualification of the specimen 200, the processor 40 for executing the clustering algorithm may process the image of the specimen 200 to be qualified (thereafter referred to "the candidate"), which is provided by the inspection apparatus 30 or acquired from the database 50, to extract a dominant color of the candidate, and then determine a correlation of the dominant color derived from the candidate and the centroid color derived from the samples. If there is no evident correlation between the dominant color derived from the candidate and the centroid color, the candidate is considered as a defective specimen.

The goal of clustering is to provide users with meaningful insights from the original data, so that they can effectively solve the problems encountered. In order to rapidly and easily determine the correlation between the dominant color derived from the candidate and the centroid color, the processor 40 may position values represent the dominant colors extracted from the candidate and values represent the centroid color derived from the samples uniquely in a plane by a set of numerical coordinates. Values represent the dominant colors extracted from the samples may be also positioned uniquely in the plane by the processor 40. In general, the distances between the values represent the dominant colors extracted from the samples and the values represent the centroid color, in the plane, should be very similar. Therefore, the candidate is determined to be a defective specimen if distances between the values represent the centroid color and the values represent the dominant color extracted from the candidate are significantly dissimilar. For example, the candidate is determined to have the discoloration issue if the distance between the values represent the centroid color and the values represent the dominant color extracted from the candidate is very great compared to the distances between the values represent the centroid color and the values represent the dominant colors extracted from the samples. That is, in the automated clustering processes, a distance function is defined, and the discernable feature of the candidate is classified to various clusters by making decisions about its relationship to the automatically-defined clusters in accordance with the distance function.

Typically, the illuminator 330 may suffer lumen depreciation with usage and produce less light output over time, and the qualified candidate may be considered as the defective specimen having the discoloration issue during the lumen depreciation occurs. In order to prevent misjudgment, the processor 40 may gather the images acquired from the samples under different lighting conditions (i.e., different levels of the lumen depreciation), and the clustering algorithm can group the images acquired using the same lighting condition together and define a centroid color of the grouped images extract from its discernable feature, such as dominant color. The dominant colors of the samples under different lighting conditions and the centroid colors of the different grouped images may be stored in the database 50 before the qualification of the specimens 200 in the lot waiting to be qualified.

During the qualification of the specimen 200, the processor 40 can process the image of the candidate to obtain a dominant color thereof, and then determine correlations of the dominant color of the candidate and the centroid colors derived from the samples under different lighting conditions. If there is no evident correlation between the dominant color of the candidate and each centroid color of the samples, the candidate is considered as a defective specimen.

In addition, the specimen qualification may be implemented by an instance segmentation algorithm to identify the presence of one or more defects in the image of each specimen 200 in the lot using image segmentation. The instance segmentation algorithm for the identification of defective specimens 200 can use a convolutional neural network (CNN) model, which is trained using classified images. The CNN model is trained by the classified images provided to the processor 50 before the specimen qualification. The classified images may be stored in the database 50 in advance.

The processor 40 may implement convolutional neural network for identification of defective specimens 200. More particularly, the processor 40 may performed instance segmentation with a mask region convolutional neural network (Mask R-CNN) for specimen qualification. The instance segmentation algorithm with the Mask R-CNN may generate pixel-wise masks for every object in an image of inspection, so that the foreground object can be easily segmented from the background. In some embodiments, the processor 40 configured to implement the specimen qualification using the Mask R-CNN may be trained to recognize the substrate 202 in which it is installed as background, while the photoresist pattern 204 may be tagged as foreground, and to generate masks for recognized objects corresponding to the defects present in the photoresist pattern 204. Once the processor 40 is trained, it can be configured to receive the images of the specimen 200 to be recognized that have been acquired by the inspection apparatus 20. The processor 40 using the Mask R-CNN can localize each of the objects in the image and construct a pixel-wise mask to segment each object from the image, thereby achieving the function of specimen qualification.

The electronic system 20 may also employ computer vision algorithms, such as OpenCV, for specimen qualification. In some embodiments, an edge detection algorithm in OpenCV is used for edge detection. The edge detection algorithm may detect boundaries between regions of contrasting image intensity by highlighting the most predominant discontinuities, thereby determining whether one or more defects are present on the specimen 200. Additionally, a matching algorithm in OpenCV is used for analyzing one or more defects present on the specimen 200. Specifically, the matching algorithm may detect the defects by comparing the image of the specimen 200 to the recognized (i.e., "the candidate") image and images acquired from qualified or defect-free specimens 200 (i.e., "the sample"). If the image of the candidate correctly matches the image of the sample, the candidate is determined to be a qualified specimen; if the image of the candidate does not match the image of the sample, the candidate is determined to be a defective specimen.

FIG. 9 is a flow diagram illustrating a specimen qualification method 70 for identifying defective specimens in accordance with some embodiments of the present disclosure. The method for qualification of specimens can be executed by the electronic system 20 shown in FIG. 3. Referring to FIG. 9, the qualification of the specimens is performed after a first fabrication process that forms a photoresist pattern on a substrate and prior to a second fabrication process of etching, deposition or implantation, wherein during the second fabrication process, the substrate is processed using the photoresist pattern as a mask. The specimen qualification process 70 including a step S702 of performing an inspection to acquire at least one image of each specimen in the lot; a step S704 of determining whether the specimen is defective or not based on the acquired image; a step S706 of notifying the on-site technicians if the specimen is a defective specimen; a step S708 of collecting the defective specimens; a step S710 of determining whether the qualified specimen needs to be sampled; a step S712 of determining whether the defective specimens have been collected and whether the qualified specimens that have been sampled are to be failed; a step S714 of collecting the failed specimens; and a step S716 of collecting the qualified specimens. The qualified specimens are then be transmitted to a substrate-processing tool for performing the second fabrication process.

The following describes an exemplary process flow of the method 70 in accordance with some embodiments of the present disclosure.

Referring to FIGS. 3 and 9, in step S702, an inspection is performed, using the inspection apparatus 30 shown in FIG. 3, to acquire one or more images of each specimen 200 in the lot. Next, an automated qualification is performed in step S704 to determine whether the specimen is defective or not based on the image(s) acquired by the inspection apparatus 30. The automated qualification is conducted by the processor 40 associated with the inspection apparatus 30. The processor 40 may execute a clustering algorithm, an instance segmentation algorithm, an edge detection algorithm and/or a matching algorithm to analyze whether one or more defects are present on the specimen 200.

After the automated qualification, a notification is shown on an operator interface(s) to alert the on-site technicians of any defective specimens, as shown in FIG. 8 (step S706), and the defective specimens (in the lot) are collected in a first cassette (step S708). In addition, it is determined whether the qualified specimens need to be sampled after the automated qualification (step S710). If the qualified specimens do not need to be sampled, all of the qualified specimens are collected (step S716) in a second cassette and then transmitted to the substrate-processing tool for performing the second fabrication process; however, if the qualified specimens need to be sampled, some portion of the qualified specimens (such as 50% of the qualified specimens) are collected in the second cassette, and a manual qualification is performed in step S712 to determine whether the other qualified specimens not collected in the second cassette are failed specimens. The manual qualification, in step S712, is performed to determine whether the defective specimens collected in the first cassette in step S708 are failed as well. The operators may identify the failed specimens from the defective specimen and the qualified specimens by the images corresponding the defective specimen and the qualified specimen and acquired by the inspection apparatus 30.

After step S712, the failed specimens are collected in a third cassette (step S714), while the defective specimens and the qualified specimens that pass the manual qualification are collected in the second cassette (step S716). The automated qualification can identify the defective specimen 200 even if it has a minor defect that does not affect the performance of the processed substrate after the second fabrication process; therefore, the manual qualification can filter such defective specimens from repeating the photolithography process, and hence reduce the manufacturing cost.

In conclusion, with the configuration of the electronic system 20, machine vision is employed to detect the defective photoresist pattern 204 to not only provide an accurate and consistent classification capability but also to perform analysis, thereby improving production efficiency and increasing profits.

One aspect of the present disclosure provides an electronic system for specimen qualification. The electronic system comprises an inspection apparatus and a processor. The inspection apparatus is configured to acquire at least one image of the specimen on which a photoresist pattern is formed using a lithography process. The processor is associated with the inspection apparatus and is configured to automatically apply machine learning processes implemented through one or more neural networks to identify at least one defect present in the photoresist pattern.

One aspect of the present disclosure provides a method of qualifying a plurality of specimens of at least one lot. The method comprises steps of inspecting the plurality of specimens for generating a plurality of images of the specimens; performing an automated qualification to determine whether at least one specimen is a defective specimen based on the images; and performing a manual qualification to identify at least one failed specimen from the defective specimens.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. An electronic system for specimen qualification, comprising:
    an inspection apparatus used for capturing at least one image of the specimen on which a photoresist pattern is formed using a lithography process;
    a processor associated with the inspection apparatus and configured to automatically apply machine learning processes implemented through one or more neural networks to process the at least one image to identify at least one defect present in the photoresist pattern on the at least one image of the specimen; and
    wherein the inspection apparatus comprises an illuminator generating and conditioning light for illuminating the specimen; and a detector detecting the light reflected from the specimen and capturing the at least one image of the specimen;
    wherein the processor is operable to identify the specimen having a discoloration issue using a clustering algorithm that groups images of the defect-free specimens together and separate from the images of the defective specimens.

2. The electronic system of claim 1, wherein the processor is operable to identify the defect on the specimen using a matching algorithm that compares the at least one image of the specimen with specifications and/or an edge detection algorithm that reveals boundaries between regions of contrasting image intensity.

3. The electronic system of claim 1, further comprising a database connected to the inspection apparatus and the processor, wherein the at least one images provided by the inspection apparatus are transmitted to and stored in the database, and the processor accesses the database to receive the at least one image for determination.

4. The electronic system of claim 3, further comprising transmission media, wherein the inspection apparatus, the processor, and the database are connected by the transmission media.

5. The electronic system of claim 1, wherein the inspection apparatus comprises:
    a stage employed to carry the specimen.

6. An electronic system for specimen qualification, comprising:
    an inspection apparatus used for capturing at least one image of the specimen on which a photoresist pattern is formed using a lithography process;
    a processor associated with the inspection apparatus and configured to automatically apply machine learning processes implemented through one or more neural networks to process the at least one image to identify at least one defect present in the photoresist pattern on the at least one image of the specimen; and
    wherein the inspection apparatus comprises an illuminator generating and conditioning light for illuminating the specimen; and a detector detecting the light reflected from the specimen and capturing the at least one image of the specimen;

wherein the processor is configured to identify the defect on the at least one image of the specimen using an instance segmentation algorithm.

7. The electronic system of claim 6, wherein the processor is operable to implement a convolutional neural network to identify the defect on the at least one image of the specimen, and the convolutional neural network for performing image segmentation is a Mask R-CNN.

8. A method of qualifying a plurality of specimens of at least one lot, the method comprising:
inspecting the plurality of specimens comprising generating and conditioning light for illuminating the specimens and detecting the light reflected from the specimen and capturing the a plurality of images of the specimens on which a photoresist pattern is formed using a lithography process;
automatically qualifying using machine learning processes implemented through one or more neural networks to analyze the images to determine whether specimens are defective specimens based on the images of the specimens; and
performing a manual qualification to identify at least one failed specimen from the defective specimens;
wherein the automated qualification is implemented by a clustering algorithm that groups the images of the defect-free specimens together and separate from the images of the defective specimens;
wherein the automated qualification is implemented by a clustering algorithm that groups the images of the defect-free specimens together and separate from the images of the defective specimens.

9. The method of claim 8, further comprising notifying on-site technicians of the defective specimens on at least one operator interface.

10. The method of claim 8, further comprising:
determining whether qualified specimens need to be sampled after the automated qualification; and
performing the manual qualification on some of the qualified specimens.

11. The method of claim 8, wherein the automated qualification is implemented by a convolutional neural network for performing image segmentation to identify a defective specimen in the acquired image.

12. The method of claim 8, wherein the automated qualification is implemented by a matching algorithm that compares the image of the specimen with specifications.

13. The method of claim 8, wherein the automated qualification is implemented by an edge detection algorithm that reveals boundaries between regions of contrasting image intensity.

* * * * *